(12) United States Patent
Sung (10) Patent No.: US 7,384,821 B2
(45) Date of Patent: Jun. 10, 2008

(54) DIAMOND COMPOSITE HEAT SPREADER HAVING THERMAL CONDUCTIVITY GRADIENTS AND ASSOCIATED METHODS

(76) Inventor: Chien-Min Sung, No. 4, Lane 32, Chung-Cheng Road, Tansui, Taipei County (TW) 23911

( * ) Notice: Subject to any disclaimer, the term of this patent is extended or adjusted under 35 U.S.C. 154(b) by 201 days.

(21) Appl. No.: 11/179,148

(22) Filed: Jul. 12, 2005

(65) Prior Publication Data
US 2005/0250250 A1  Nov. 10, 2005

Related U.S. Application Data (62) Division of application No. 10/775,543, filed on Feb. 9, 2004, now Pat. No. 6,987,318.

(51) Int. Cl.
*H01L 23/373* (2006.01)
(52) U.S. Cl. .................. 438/122; 257/E23.111
(58) Field of Classification Search ............ 438/106, 438/121, 122; 257/E23.111
See application file for complete search history.

(56) References Cited

U.S. PATENT DOCUMENTS

| | | |
|---|---|---|
| 3,574,580 A | 4/1971 | Stromberg et al. |
| 3,678,995 A | 7/1972 | Collard |
| 3,828,848 A | 8/1974 | Custers et al. |
| 3,872,496 A | 3/1975 | Potter |
| 3,912,500 A | 10/1975 | Vereschagin et al. |
| 3,913,280 A | 10/1975 | Hall |
| 3,949,263 A | 4/1976 | Harper |
| 4,231,195 A | 11/1980 | DeVries et al. |
| 4,378,233 A | 3/1983 | Carter |
| 4,576,224 A | 3/1986 | Eaton et al. |
| 4,649,992 A | 3/1987 | Geen et al. |
| 4,948,388 A | 8/1990 | Ringwood |

(Continued)

FOREIGN PATENT DOCUMENTS

JP          09312362 A      12/1997

OTHER PUBLICATIONS

Horton, M. D. et al., "Sintered Diamond," International Industrial Diamond Association Symposium, Washington, D. C. (1974) pp. 1-6.

(Continued)

*Primary Examiner*—Marcos D. Pizarro
(74) *Attorney, Agent, or Firm*—Thorpe North & Western LLP (57) ABSTRACT

A diamond composite heat spreader having a variable thermal conductivity gradient can improve control of heat transfer based on a specific application. A diamond-containing region of the heat spreader can contain diamond particles such that the diamond concentration and/or the diamond particle size a varied to produce a desired thermal conductivity gradient. Regions proximate to a heat source can have a higher thermal conductivity than regions further away from the heat source. Thin diamond films can also be used in conjunction with the particulate diamond in order to provide a region of maximum thermal conductivity adjacent a heat source. By providing a variable thermal conductivity gradient, more expensive materials such as diamond film and larger diamond particles can be selectively used in regions closer to a heat source, while allowing for cheaper smaller diamond particles and materials to be used farther away from the heat source where thermal conductivity can be lower without sacrificing overall performance.

17 Claims, 4 Drawing Sheets

U.S. PATENT DOCUMENTS

| | | |
|---|---|---|
| 5,070,936 A | 12/1991 | Carroll et al. |
| 5,096,465 A * | 3/1992 | Chen et al. .................... 51/295 |
| 5,120,495 A | 6/1992 | Supan et al. |
| 5,130,771 A | 7/1992 | Burnham et al. |
| 5,382,314 A | 1/1995 | Jin |
| 5,614,320 A | 3/1997 | Beane et al. |
| 5,642,779 A | 7/1997 | Yamamoto et al. |
| 5,696,665 A | 12/1997 | Nagy |
| 5,719,441 A | 2/1998 | Larimer |
| 5,783,316 A | 7/1998 | Colella et al. |
| 5,786,075 A | 7/1998 | Mishuku et al. |
| 5,895,972 A | 4/1999 | Paniccia |
| 6,031,285 A | 2/2000 | Nishibayashi |
| 6,167,948 B1 | 1/2001 | Thomas |
| 6,238,454 B1 | 5/2001 | Polese et al. |
| 6,264,882 B1 | 7/2001 | Colella et al. |
| 6,270,848 B1 | 8/2001 | Nishibayashi |
| 6,335,863 B1 | 1/2002 | Yamamoto et al. |
| 6,337,513 B1 | 1/2002 | Clevenger et al. |
| 6,361,857 B1 | 3/2002 | Saito et al. |
| 6,390,181 B1 | 5/2002 | Hall et al. |
| 6,413,589 B1 | 7/2002 | Li |
| 6,448,642 B1 | 9/2002 | Bewley et al. |
| 6,482,248 B1 | 11/2002 | Holloway |
| 6,517,221 B1 | 2/2003 | Xie |
| 6,538,892 B2 | 3/2003 | Smalc |
| 6,541,115 B2 | 4/2003 | Pender et al. |
| 7,014,093 B2 * | 3/2006 | Houle et al. ................ 228/56.3 |
| 2002/0023733 A1 | 2/2002 | Hall et al. |

OTHER PUBLICATIONS

Pope, B. J. et al., "Sintered Diamond: Its Possible Use as a High Thermal Conductivity Semiconduction Device Substrate," Proc. 4$^{th}$ International Conference on High Pressure (AIRAPT), Kyoto, Japan (1974), 1-5.

Hall, H. Tracy, "Sintered Diamonds," Science, Aug. 28, 1970, pp. 1-2, vol. 169.

Sun, Q. et al., "Fabrication & characterization of diamond/copper composites for thermal management substrate applications," Materials Science & Engineering (1996) pp. 261-266, vol. B41.

* cited by examiner

DIAMOND COMPOSITE HEAT SPREADER HAVING THERMAL CONDUCTIVITY GRADIENTS AND ASSOCIATED METHODS

PRIORITY INFORMATION

This application is a divisional of U.S. patent application Ser. No. 10/775,543, filed Feb. 9, 2004, now U.S. Pat. No. 6,987,318 which is incorporated by reference herein.

FIELD OF THE INVENTION

The present invention relates to carbonaceous composite devices and systems that can be used to conduct or absorb heat away from a heat source. Accordingly, the present invention involves the fields of chemistry, physics, semiconductor technology, and materials science.

BACKGROUND OF THE INVENTION

Progress in the semiconductor industry has been following the trend of Moore's Law that was proposed in 1965 by then Intel's cofounder Gordon Moore. This trend requires that the capability of integrated circuits (IC) or, in general, semiconductor chips double every 18 months. Thus, the number of transistors on a central processing unit (CPU) in 2002 may approach 100 million. As a result of this densification of circuitry, line-width in 2003 narrowed to 0.13 micrometer and more advanced chips are using wires as thin as 0.09 micrometer (90 nm).

Along with such advances comes various design challenges. One of the often overlooked challenges is that of heat dissipation. Most often, this phase of design is neglected or added as a last minute design before the components are produced. According to the second law of thermodynamics, the more work that is performed in a closed system, the higher entropy it will attain. With the increasing power of a CPU, the larger flow of electrons produces a greater amount of heat. Therefore, in order to prevent the circuitry from shorting or burning out, the heat resulting from the increase in entropy must be removed. Some state-of-the-art CPUs have a power of about 60 watts (W). For example, a CPU made with 0.13 micrometer technology may exceed 100 watts. Current methods of heat dissipation, such as by using metal (e.g., Al or Cu) fin radiators, and water evaporation heat pipes, will be inadequate to sufficiently cool future generations of CPUs.

Recently, ceramic heat spreaders (e.g., AlN) and metal matrix composite heat spreaders (e.g., SiC/Al) have been used to cope with the increasing amounts of heat generation. However, such materials have a thermal conductivity that is no greater than that of Cu, hence; their ability to dissipate heat from semiconductor chips is limited.

A typical semiconductor chip contains closely packed metal conductors (e.g., Al, Cu) and ceramic insulators (e.g., oxide, nitride). The thermal expansion of metal is typically 5-10 times that of ceramics. When the chip is heated to above 60° C., the mismatch of thermal expansions between metal and ceramics can create microcracks. The repeated cycling of temperature tends to aggravate the damage to the chip. As a result, the performance of the semiconductor will deteriorate. Moreover, when temperatures reach more than 90° C., the semiconductor portion of the chip may become a conductor so the function of the chip is lost. In addition, the circuitry may be damaged and the semiconductor is no longer usable (i.e. becomes "burned out"). Thus, in order to maintain the performance of the semiconductor, its temperature must be kept below a threshold level (e.g., 90° C.).

A conventional method of heat dissipation is to contact the semiconductor with a metal heat sink. A typical heat sink is made of aluminum that contains radiating fins. These fins are attached to a fan. Heat from the chip will flow to the aluminum base and will be transmitted to the radiating fins and carried away by the circulated air via convection. Heat sinks are therefore often designed to have a high heat capacity to act as a reservoir to remove heat from the heat source.

Alternatively, a heat pipe may be connected between the heat sink and a radiator that is located in a separated location. The heat pipe contains water vapor that is sealed in a vacuum tube. The moisture will be vaporized at the heat sink and condensed at the radiator. The condensed water will flow back to the heat sink by the wick action of a porous medium (e.g., copper powder). Hence, the heat of a semiconductor chip is carried away by evaporating water and removed at the radiator by condensing water.

Although heat pipes and heat plates may remove heat very efficiently, the complex vacuum chambers and sophisticated capillary systems prevent designs small enough to dissipate heat directly from a semiconductor component. As a result, these methods are generally limited to transferring heat from a larger heat source, e.g., a heat sink. Thus, removing heat via conduction from an electronic component is a continuing area of research in the industry.

One promising alternative that has been explored for use in heat spreaders is diamond-containing materials. Diamond can carry away heat much faster than any other material. The thermal conductivity of diamond at room temperature (about 2000 W/mK) is five times higher than copper (about 400 W/mK) and eight times that of aluminum (250 W/mK), the two fastest metal heat conductors commonly used. Moreover, the thermal diffusivity of diamond (12.7 $cm^2$/sec) is eleven times that of copper (1.17 $cm^2$/sec) or aluminum (0.971 $cm^2$/sec). The ability for diamond to carry away heat without storing it makes diamond an ideal heat spreader. In contrast to heat sinks, a heat spreader acts to quickly conduct heat away from the heat source without storing it. Table 1 shows various thermal properties of several materials as compared to diamond (values provided at 300 K).

TABLE 1

| Material | Thermal Conductivity (W/mK) | Heat Capacity (J/$cm^3$ K) | Thermal Expansion (ppm/K) |
| --- | --- | --- | --- |
| Copper | 401 | 3.44 | 16.4 |
| Aluminum | 237 | 2.44 | 24.5 |
| Molybdenum | 138 | 2.57 | 47.5 |
| Gold | 317 | 2.49 | 14.5 |
| Silver | 429 | 2.47 | 18.7 |
| Tungsten Carbide | 95 | 2.95 | 5.7 |
| Silicon | 148 | 1.66 | 2.6 |
| Diamond (IIa) | 2,300 | 1.78 | 1.4 |

In addition, the thermal expansion coefficient of diamond is one of the lowest of all materials. The low thermal expansion of diamond makes joining it with low thermally expanding silicon semiconductor much easier. Hence, the stress at the joining interface can be minimized. The result is a stable bond between diamond and silicon that does not delaminate under the repeated heating cycles.

In recent years diamond heat spreaders have been used to dissipate heat from high power laser diodes, such as that used by laser diodes to boost the light energy in optical fibers. However, large area diamonds are very expensive; hence, diamond has not been commercially used to spread the heat generated by CPUs. In order for diamond to be used as a heat spreader, its surface must be polished so it can make an intimate contact with the semiconductor chip. Moreover, its surface may be metallized (e.g., by Ti/Pt/Au) to allow attachment to a conventional metal heat sink by brazing.

Many current diamond heat spreaders are made of diamond films formed by chemical vapor deposition (CVD). One example of raw CVD diamond films are now sold at over $10/cm$^2$, and this price may be doubled when it is polished and metallized. This high price would prohibit diamond heat spreaders from being widely used except in those applications (e.g., high power laser diodes) where only a small area is required or no effective alternative heat spreaders are available. In addition to being expensive, CVD diamond films can only be grown at very slow rates (e.g., a few micrometers per hour); hence, these films seldom exceed a thickness of 1 mm (typically 0.3-0.5 mm). However, if the heating area of the chip is large (e.g., a CPU), it is preferable to have a thicker (e.g., 3 mm) heat spreader.

In addition to diamond products produced using CVD methods, attempts have been made to form heat spreaders using a mass of particulate diamond or "polycrystalline diamond" (PCD). Specific examples of such devices are found in U.S. Pat. No. 6,390,181, and U.S. Patent Application Publication No. 2002/0023733, each of which is incorporated herein by reference. Typically, a PCD product (or "compact") is formed by sintering diamond particles under high-pressure, high-temperature (HPHT) conditions to using cobalt as a sintering aid. Alternatively, silicon or its alloy can be used to cement diamond particles together, as described in U.S. Pat. Nos. 4,124,401 and 4,534,773. As a result, most PCD compacts have a relatively small diamond table thickness, e.g., about 0.5 mm, that limits their use as a heat spreader for large components. Moreover, diamond particles used in typical sintering processes have a particle size in the micron range. Thus, PCD compacts typically have extensive grain boundaries with a low conductivity second phase surrounding individual grains. Such PCD compacts are of limited use in the field of heat spreaders because of their limited physical capacity to transfer or conduct heat.

As such, cost effective systems and devices that are capable of effectively conducting heat away from a heat source, continue to be sought through ongoing research and development efforts.

SUMMARY OF THE INVENTION

Accordingly, the present invention provides composite heat spreaders that can be used to draw or conduct heat away from a heat source. In one aspect, a diamond composite heat spreader can have a variable thermal conductivity gradient which improves control of heat transfer through the heat spreader. A diamond-containing region of the heat spreader can contain diamond particles such that the diamond concentration and/or the diamond particle size are varied to produce a desired thermal conductivity gradient throughout the heat spreader. Regions proximate to a heat source can have a higher thermal conductivity than regions further away from the heat source.

By providing a variable thermal conductivity gradient, more expensive materials such as diamond film and larger diamond particles can be selectively used in regions closer to a heat source, while allowing for cheaper smaller diamond particles and materials to be used farther away from the heat source where available volumes are larger so thermal conductivity can be lower without sacrificing overall performance.

In another aspect of the present invention, thin diamond films can also be used in conjunction with the particulate diamond in order to provide a region of maximum thermal conductivity adjacent a heat source.

In one detailed aspect of the present invention, the thermal conductivity gradient can be substantially determined by variations in volume concentration of diamond such that variations can be substantially continuous or stepwise. Similarly, in other aspects, the variations in concentration can be governed by providing a plurality of regions having a varying mean free thermal path across diamond material. The mean free thermal path can be strongly affected by varying the average diamond particle size and their respective occupying volume along the thermal conductivity gradient.

There has thus been outlined, rather broadly, various features of the invention so that the detailed description thereof that follows may be better understood, and so that the present contribution to the art may be better appreciated. Other features of the present invention will become clearer from the following detailed description of the invention, taken with the accompanying claims, or may be learned by the practice of the invention.

It will be understood that the above figures are merely for illustrative purposes in furthering an understanding of the invention. Further, the figures are not drawn to scale, thus dimensions, particle sizes, and other aspects may, and generally are, exaggerated to make illustrations thereof clearer. Therefore, departure can be made from the specific dimensions and aspects shown in the figures in order to produce the heat spreaders of the present invention.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," "an" and, "the" include plural referents unless the context clearly dictates otherwise. Thus, for example, reference to "a diamond particle" includes one or more of such particles, reference to "an interstitial material" includes reference to one or more of such materials, and reference to "the particle" includes reference to one or more of such particles.

Definitions

In describing and claiming the present invention, the following terminology will be used in accordance with the definitions set forth below.

As used herein, "particle" and "grit" may be used interchangeably, and when used in connection with a carbonaceous material, refer to a particulate form of such material. Such particles or grits may take a variety of shapes, including round, oblong, square, euhedral, etc., as well as a number of specific mesh sizes. As is known in the art, "mesh" refers to the number of holes per unit area as in the case of U.S. meshes. All mesh sizes referred to herein are U.S. mesh unless otherwise indicated. Further, mesh sizes are generally understood to indicate an average mesh size of a given collection of particles since each particle within a particular "mesh size" may actually vary over a small distribution of sizes.

As used herein, "substantial," or "substantially" refers to the functional achievement of a desired purpose, operation, or configuration, as though such purpose or configuration had actually been attained. Therefore, carbonaceous particles that are substantially in contact with one another function as though, or nearly as though, they were in actual contact with one another. In the same regard, carbonaceous particles that are of substantially the same size operate, or obtain a configuration as though they were each exactly the same size, even though they may vary in size somewhat.

As used herein, "heat spreader" refers to a material which distributes or conducts heat and transfers heat away from a heat source. Heat spreaders are distinct from heat sinks which are used as a reservoir for heat to be held in, until it can be transferred away from the heat sink by another mechanism, whereas a heat spreader may not retain a significant amount of heat, but merely transfers heat away from a heat source.

As used herein, "heat source" refers to a device or object having an amount of thermal energy or heat which is greater than desired. Heat sources can include devices that produce heat as a byproduct of their operation, as well as objects that become heated to a temperature that is higher than desired by a transfer of heat thereto from another heat source.

As used herein, "carbonaceous" refers to any material which is made primarily of carbon atoms. A variety of bonding arrangements or "allotropes" is known for carbon atoms, including planar, distorted tetrahedral, and tetrahedral bonding arrangements. As is known to those of ordinary skill in the art, such bonding arrangements determine the specific resultant material, such as graphite, diamond-like carbon (DLC), or amorphous diamond, and pure diamond. In one aspect, the carbonaceous material may be diamond.

As used herein, "reactive element" and "reactive metal" may be used interchangeably, and refer to an element, especially a metal element that can chemically react with and chemically bond to carbon by forming a carbide bond. Examples of reactive elements may include without limitation, transition metals such as titanium (Ti) and chromium (Cr), including refractory elements, such as zirconium (Zr) and tungsten (W), as well as non-transition metals and other materials, such as aluminum (Al). Further, certain non-metal elements such as silicon (Si) may be included as a reactive element in a brazing alloy.

As used herein "wetting" refers to the process of flowing a molten metal across at least a portion of the surface of a carbonaceous particle. Wetting is often due, at least in part, to the surface tension of the molten metal, and may be facilitated by the use or addition of certain metals to the molten metal. In some aspects, wetting may aid in the formation of chemical bonds between the carbonaceous particle and the molten metal at the interface thereof when a carbide forming metal is utilized.

As used herein, "chemical bond" and "chemical bonding" may be used interchangeably, and refer to a molecular bond that exerts an attractive force between atoms that is sufficiently strong to create a binary solid compound at an interface between the atoms. Chemical bonds involved in the present invention are typically carbides in the case of diamond superabrasive particles, or nitrides or borides in the case of cubic boron nitride.

As used herein, "braze alloy" and "brazing alloy" may be used interchangeably, and refer to an alloy containing a sufficient amount of a reactive element to allow the formation of chemical bonds between the alloy and a superabrasive particle. The alloy may be either a solid or liquid solution of a metal carrier solvent having a reactive element solute therein. Moreover, the term "brazed" may be used to refer to the formation of chemical bonds between a superabrasive particle and a braze alloy.

As used herein, "sintering" refers to the joining of two or more individual particles to form a continuous solid mass. The process of sintering involves the consolidation of particles to at least partially eliminate voids between particles. Sintering may occur in either metal or carbonaceous particles, such as diamond. Sintering of metal particles occurs at various temperatures depending on the composition of the material. Sintering of diamond particles generally requires ultrahigh pressures and the presence of a carbon solvent as a diamond sintering aid, and is discussed in more detail below. Sintering aids are often present to aid in the sintering process and a portion of such may remain in the final product.

As used herein, "mean free thermal path" refers to a path across which heat can transfer without crossing a solid-solid interface. Further, mean free thermal path generally corresponds to the average diameter of diamond particles in a given region or in the case of DLC, the thickness of the layer along the direction of a thermal gradient. Thus, a mean free thermal path corresponds to a path through substantially continuous diamond such that the path is substantially free of thermal contact resistance associated with solid-solid interfaces. Although, the mean free thermal path generally corresponds to continuous diamond, various impurities embedded within the diamond can decrease this mean free path and thus the overall thermal conductivity of the diamond-containing material in that region.

As used herein, "heat exit region" refers to a region of the diamond-containing material designed to correspond to a region of relatively low thermal conductivity. The heat exit region does not necessarily correspond to a region of preferential flow of heat. For example, typically, heat will flow preferentially along a path of least thermal resistance. However, in some embodiments, the heat exit region has a relatively low thermal conductivity, i.e. high thermal resistance.

As used herein, "thermal conductivity gradient" refers to the thermal conductivity changes as a function of position across the heat spreader in all three dimensions. The thermal conductivity gradient can be a continuous or discontinuous function of position. Therefore, gradual changes and step-wise changes in thermal conductivity are encompassed by the term thermal conductivity gradient.

Concentrations, amounts, particle sizes, volumes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited.

As an illustration, a numerical range of "about 1 micrometer to about 5 micrometers" should be interpreted to include not only the explicitly recited values of about 1 micrometer to about 5 micrometers, but also include individual values and sub-ranges within the indicated range. Thus, included in this numerical range are individual values such as 2, 3, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

The Invention

A diamond composite heat spreader having a variable thermal conductivity gradient can improve control of heat transfer properties of the heat spreader. Regions proximate to a heat source can have a higher thermal conductivity than regions further away from the heat source. A particulate diamond region can incorporate diamonds having varying particles sizes and/or volume concentrations in order to affect the thermal conductivity profile. Thin diamond films can also be used in conjunction with the particulate diamond in order to provide a region of maximum thermal conductivity adjacent a heat source. By providing a variable thermal conductivity gradient, thermal conduction of heat throughout the heat spreader can be specifically engineered to achieve a desired temperature profile during use. The particulate diamond region can be formed in a wide variety of ways such as those discuss immediately below.

Particulate Diamond Region

The present invention encompasses devices, systems, and methods for transferring heat away from a heat source. Heat spreaders made in accordance with the method of the present invention generally contain a plurality of carbonaceous particles, including embodiments in which carbonaceous particles are each substantially in contact with one another. The plurality of carbonaceous particles may either be bound together using an interstitial material or by direct sintering or fusing of the carbonaceous particles themselves into a mass.

In one aspect, a general process for making a heat spreader having a high carbonaceous particle volume begins with the packing of a first plurality of carbonaceous particles in a suitable mold. Optionally, the first plurality of particles may each be approximately the same mesh size. However, a wide particle size distribution can also be used to increase packing density. The specific size of these particles may be up to about 18 mesh (1 mm) with sizes between about 30 mesh (0.5 mm) and about 400 mesh (37 micrometers) being typical. While the size of the particles may vary, the general principle is recognized that larger carbonaceous particles provide for a larger path having improved heat transfer characteristics which approach that of a solid carbonaceous material, such as pure diamond.

The particles are packed such that there is substantial contact between particles. Each particle should be in contact with at least one other particle in the packed group. Thus, there may be groups of particles which are in contact with one another separate from the remaining particles. In another aspect of the present invention the contact between particles may be sufficient to provide a continuous path to substantially all of the carbonaceous particles in the heat spreader. The transfer of heat away from the heat source is facilitated by the substantial particle-particle contact. The particles can be packed so as to occupy most of the volume and minimize the amount of empty void between particles.

In one aspect, particle packing that obtains the above-recited goals may be achieved by packing carbonaceous particles of different sizes in successive stages. For example, larger carbonaceous particles are packed into a suitable mold. The packing of the carbonaceous particles may be improved by settling or otherwise compacting, e.g., agitated inside the mold by a vibrator. A plurality of smaller carbonaceous particles may then be added to fill the voids surrounding the larger carbonaceous particles. Depending on the size of the smaller particles, the smaller particles may need to be introduced from multiple sides of the packed carbon material in order to fill most of the available voids. The size of the smaller carbonaceous particles may vary. Typically particles in the range of between about $\frac{1}{3}^{rd}$ to about $\frac{1}{20}^{th}$ of the diameter of the larger diamond will increase the packing efficiency. Particles which are between about $\frac{1}{5}^{th}$ and about $\frac{1}{10}^{th}$ may also be used, while particles $\frac{1}{7}^{th}$ the diameter of the larger particles have been used with good results. Using such successive packing stages, the volume packing efficiency may reach greater than two-thirds. If necessary, addition of even smaller carbonaceous particles may be performed to increase the packing efficiency further. However, this successive packing method will soon reach a point of diminishing returns as the filling becomes more and more difficult while the increase in packing efficiency becomes less and less. The packed particles made in accordance with the above principles in mind will provide a carbon volume content of between about 50% and about 80%.

In an alternative embodiment, the different sized carbonaceous particles are mixed first and then packed together prior to introduction of the interstitial material. This approach allows for an increase in packing efficiency, however, some thermal benefits may be sacrificed as a result of the larger particles not being in intimate contact with other larger particles. Thus, heat must cross a greater number of particle-particle interface boundaries increasing the thermal resistance of the final heat spreader.

In yet another alternative embodiment, the volume of diamond may be increased by using uniformly shaped carbonaceous particles. In particular, substantially cubic diamond particles are commercially available, although other shapes could be used. The cubic diamonds may be packed edge-to-edge to produce a layer, or layers, of packed diamond particles with a diamond volume content of up to about 90%-95%. The specific arrangement is unimportant and the particles may be packed in ordered rows and columns or the rows and columns may be staggered. In this embodiment, the arrangement of diamond particles allows for substantially smaller volume of void between particles without sintering the diamond particles together. In addition, the thermal properties of the final composite are improved if the particles are all oriented in the same direction as opposed to random directions. The following discussions of interstitial materials and processing apply to this arrangement of packed diamond particles as to the above described packed diamond particles.

In one aspect of the invention, an interstitial material may be used in connection with the carbonaceous particles in order to bond them together into a composite mass. However, by packing the particles prior to introduction of the interstitial material as recited above, the original particle-to-particle contact can be maintained so that the packing efficiency far exceeds the efficiency obtained by first mixing the carbonaceous particles with an interstitial material and then consolidating by hot pressing. In the latter case, the carbonaceous particles are likely to constitute less than one-half of the device volume, as the interstitial material tends to fill around diamond particles and between them, thus completely separating many particles from one another. In this case, heat must cross significant areas of non-carbonaceous material.

Thus, in accordance with one aspect of the present invention, the carbonaceous particles are packed before the introduction of any non-carbonaceous materials as discussed above. One factor to consider in designing a carbonaceous composite heat spreader of the present invention is the thermal properties of the composite at the interfaces between carbonaceous particles and the interfaces between non-carbonaceous material and carbonaceous particles. Empty voids and mere mechanical contact between interfaces act as a thermal barriers, i.e. commonly referred to as thermal contact resistance. Although intimate contact of carbonaceous particles along a significant portion of the surface of the particles improves the thermal properties at these boundaries, the result is somewhat inferior to that of pure continuous carbonaceous material. Thus, it is desirable that a substantial portion of the interfaces are more than mere mechanical contact.

Accordingly, an interstitial material may be utilized having specific characteristics suitable to achieving a particular finished tool. In one aspect, the interstitial material may be suitable to act as a carbon sintering aid under ultrahigh pressure to sinter or actually fuse the carbonaceous particles together. In another aspect of the present invention, an interstitial material may be selected which chemically bonds the packed diamond particles together.

The choice of interstitial material must account for the thermal conductivity and heat capacity of the interstitial material itself. A diamond compact heat spreader which contains material having a low thermal conductivity will act as a limiting element within the structure thus obviating some of the heat transfer benefits of diamond. Therefore, an interstitial material which has high thermal conductivity, low heat capacity, and provides for a chemical bond with diamond greatly facilitates the heat transfer across interface boundaries. Of course, a larger degree of diamond-diamond contact will also improve the heat transfer properties of the heat spreader.

The interstitial material for bonding or sintering of carbonaceous particles may be provided in a number of ways including infiltration, sintering and electro-deposition. Infiltration occurs when a material is heated to its melting point and then flows as a liquid through the interstitial voids between particles. Sintering occurs when the interstitial material is heated sufficient to cause neighboring particles of material to melt near their edges and sinter neighboring particles together in an essentially solid-state process. Thus, substantially no fluid flow of the interstitial material would occur. Electro-deposition involves depositing a metal heated above its melting point in solution on the surface of the carbonaceous particles under an electrical current.

Two basic categories of interstitial material include liquid metal and molten ceramics. When bonding the carbonaceous particles to produce a carbonaceous composite heat spreader the interstitial material should contain at least one active element that will react with carbon to form carbide. The presence of a carbide former aids in the wetting of the diamond particles and causes the interstitial material to be pulled into the interstitial voids by capillary force. When sintering the carbonaceous particles to produce a carbonaceous heat spreader, the interstitial material should act as a sintering aid to increase the degree of carbon sintering and does not necessarily contain a carbide former but rather contains a carbon solvent.

In one aspect of the present invention, an interstitial infiltrating alloy can be used as an infiltrant to bond the carbonaceous particles into a substantially solid heat spreading mass. As mentioned above, many interstitial materials may actually hinder the transfer of heat through the heat spreader. For example, interstitial materials that do not chemically bond with carbon, but merely hold it mechanically can slow down the transfer of heat. However, copper can be used as an interstitial material as described herein. In this case, a tight interface between the copper and diamond particles can avoid excessive thermal contact resistance by substantially eliminating gaps therebetween. Further, many refractory materials that are good carbide formers are poor heat conductors.

An additional consideration, when the carbonaceous material is diamond, is that care must be taken in choosing an interstitial material so as to avoid an infiltration or sintering temperature that is high enough to damage the diamond. Therefore, in one aspect of the invention, the interstitial material may be an alloy that melts or sinters below about 1,100° C. When heating above this temperature, the time should be minimized to avoid excessive damage to the diamond particles. Damage to the diamond particles may also be induced internally due to cracking of the diamond from the site of metal inclusions. Synthetic diamonds almost always contain a metal catalyst (e.g., Fe, Co, Ni or its alloy) as inclusions. These metal inclusions have high thermal expansion coefficients and they can back-convert diamond into graphitic carbon. Hence, at high temperature, diamond can crack due to the different thermal expansion of metal inclusions or back-convert diamond to carbon. However, back-conversion can be substantially eliminated by infiltrating or sintering diamond under an ultrahigh pressure in the stability region of diamond, e.g., greater than about 5 GPa.

In accordance with the present invention, interstitial materials may contain a diamond or carbon braze as a metal infiltrant or silicon alloys as ceramic infiltrants. Moreover, the infiltrant may be able to "wet" carbon so it can be wicked in the interstitial of carbonaceous particles by capillary force. The interstitial material substantially fills any of the remaining voids between the packed carbonaceous particles. Common carbon wetting agents include Co, Ni, Fe, Si, Mn, and Cr. When the carbonaceous particles are to be chemically bonded together the interstitial material may contain a carbide former which provides for improved thermal properties at the boundaries between particles. Such carbide formers include Sc, Y, Ti, Zr, Hf, V, Nb, Cr, Mo, Mn, Ta, W, Tc, Si, B, Al, and alloys thereof.

Interstitial or infiltrating materials of the present invention may include a component such as Ag, Cu, Al, Si, Fe, Ni, Co, Mn, W, or their alloys or mixtures. Diamond or carbon brazes include Fe, Co, or Ni alloys which exhibit wetting of the carbonaceous particles. Alloys of these brazes may also contain a carbide former such as Ti, Zr, or Cr. Ceramic silicon alloys may contain Ni, Ti, or Cr. For example, Ni—Cr alloys, such as BNi2 (Ni—Cr—B) or BNi7 (Ni—Cr—P) are good infiltrants. Other examples of effective infiltrants include Al—Si, Cu—Sn—Ti, Ag—Cu—Ti, Cu—Mn—Si, Cu—Mn—Zr, and Cu—Ni—Zr—Ti. Most carbonaceous interstitial materials contain active elements (e.g., Cr, Ti) that not only bond to carbon by forming carbide, but are also easily oxidized. Hence, the introduction of interstitial materials should be performed in a vacuum furnace or under the protection of an inert atmosphere.

The above carbonaceous composite heat spreaders can be produced by at least partially filling in the pores or gaps among carbonaceous particles by an interstitial material that can conduct heat relatively fast. The interstitial material may be introduced into the packed particles in a variety of ways. One way to provide the interstitial material is by electrodeposition (e.g., Ag, Cu, Ni) in a water solution. Although substantially no chemical bonds are formed between the deposited metal and diamond, this can still be an effective interstitial material. The metal is most often provided in an acid solution and may be performed by those skilled in this art. Various additional elements may also be added to lessen the surface tension of the solution or to otherwise improve infiltration into the voids.

In another aspect of the invention, a carbonaceous heat spreader is provided that includes a plurality of carbonaceous particles present in an amount of at least about 50% by volume of the heat spreader. A non-carbonaceous infiltrant is present in an amount of at least about 5% by volume of the heat spreader. The non-carbonaceous infiltrant can include an element selected from the group consisting of Cu, Al and Ag. In a further aspect of this embodiment, the carbonaceous particles can be present in an amount of at least about 80% by volume of the heat spreader, or at least 90% by volume of the heat spreader.

As in other aspects of the invention, the carbonaceous particles can comprise diamond particles. The diamond particles can be present in an amount of greater than about 50% by volume of the heat spreader. The infiltrant, which can contain at least about 2% w/w of a carbide former, can be present in an amount of greater than about 5% by volume of the heat spreader.

In another aspect of the invention, a heat spreader is provided that includes carbonaceous particles and a non-carbonaceous infiltrant that may or may not chemically bond to the carbonaceous particles. In this embodiment, the non-carbonaceous infiltrant can be, for example, Cu, Al or Ag. By processing the heat spreader under relatively high pressures, the non-carbonaceous infiltrant increase the resulting heat spreading capacity of the heat spreader while increasing the packing density of the carbonaceous particles. For instance, in the case where the carbonaceous particles are diamond, when the heat spreader is processed at ultra-high pressure the diamond grains can at least partially crush at diamond-to-diamond contact points. As the diamond particles are crushed, the packing density of diamond increases. Further, molten Cu, Al or Ag can be partially injected into the diamond grains. Heat spreaders formed in this embodiment can have a diamond concentration over 90% by volume.

As the resulting heat spreader includes a high concentration of diamond particles, with substantially all of the voids between diamond particles being filled with Cu, Al, or Ag, the heat spreader can exhibit a high degree of thermal conductivity. Heat spreaders made in accordance with this embodiment have been found to exhibit thermal conductivity on the order of 1½ to 3 times that of pure copper. In addition, as Cu, Al and Ag, in minor proportions, are relatively inexpensive materials, a heat spreader in accordance with this embodiment can be made at commercially competitive costs. Also, as Cu, in particular, has relatively low melting point (below about 1100° C.), the process can be conducted at lower temperatures and pressure that may otherwise be required in conventional diamond PCD formation processes.

Some prior art diamond composite heat spreaders have been formed using diamond particles coated with a carbide or carbide forming material. In contrast, in one aspect of the present invention, the diamond particles and Cu, Al or Ag can each be used in their base, untreated form. This can eliminate the costly process of coating diamond particles prior to infiltrating a mass of the particles with an infiltrant. In addition, the diamond particles used in heat spreaders in accordance with the present invention can utilize diamond particles having a relatively coarse grain, for example grains of 50 microns and larger, e.g., 300 microns. This can result in fewer grain boundaries present to slow down heat flow.

Another way to provide the interstitial material is by sintering of a solid powder in the voids between carbonaceous particles. Sintering may be accomplished in a variety of ways, known to those skilled in the art such as, but not limited to, hot pressing, pressure-less sintering, vacuum sintering, and microwave sintering. Although hot pressing is a common method, microwave sintering is becoming an increasingly useful method as it allows for faster sintering times and decreased porosity. This is particularly advantageous in the present invention because the microwave acts to primarily heat the sinterable metal material rather than the carbon. When diamond is used, this helps to reduce degradation of the diamond during processing.

A sinterable interstitial material may be provided during the packing process, in which case the sintered material occupies much of the space between carbonaceous particles and prevents substantial particle-particle contact. However, the sinterable interstitial material may be introduced in a similar manner to that used in successive packing of smaller diamond particles, wherein the size of the interstitial material is chosen so as to allow the material to partially fill the voids between carbonaceous particles after the carbonaceous particles have been packed. Once the voids are sufficiently filled, the interstitial material is sintered. In this manner the particle-particle contact can be improved. However, sintering in this manner typically leaves a substantial number of pores which can reduce thermal conductivity.

A third way to provide the interstitial material is to infiltrate diamond particles with a molten material (e.g., Al, Si, BNi2). The electro-deposited metal cannot bond carbon chemically so carbonaceous particles are entrapped inside. Further, the sintered material may not hold particles firmly because bonding to carbonaceous particles during sintering is primarily mechanical. The infiltrant should contain an active element so it can react with carbon to form chemical bonds in the form of carbide. The presence of a carbide former also allows the infiltrant to wet the particle surface and draw the infiltrant further into the interstitial voids by capillary action.

When diamond particles are used, in order to minimize the diamond degradation, the infiltration is preferably performed at a temperature below 1,100° C. or under high pressures in the stability region of diamond. Some of the Fe, Ni, and Co alloys and most of the Cu, Al and Ag alloys mentioned above have melting temperatures in this range. During infiltration or sintering of an interstitial material, the hot metal will inevitably cause some small degree of diamond degradation. However, this effect may be minimized by reducing the processing time and carefully choosing the interstitial material. Silicon is particularly good at filling the interstitial voids between diamond particles due to its tendency to form SiC by reaction. The formation of SiC at the interface between diamond and molten Si may protect diamond from further deterioration. The melting temperature of pure Si is approximately 1,400° C. Under a high vacuum (e.g. below about $10^{-3}$ such as $10^{-5}$ torr), molten Si or its alloy can infiltrate into diamond effectively without excessively damaging diamond so a good heat spreader can be fabricated.

Thus, the interstitial material may be introduced into the packed carbonaceous particles by infiltration, sintering or electro-deposition. When performed at low pressures, these interstitial materials merely fill the voids between particles and bond the particles together. At very high pressures there are two basic possibilities. First, the interstitial material may chemically bond with the carbon and/or provide beneficial thermal properties across the carbonaceous material to interstitial material interface and the carbonaceous material will be partially crushed to eliminate a portion of the voids. Second, if the interstitial material is a carbon solvent such as, but not limited to, iron, cobalt, nickel or alloys of these materials, the carbonaceous particles will sinter together to form a continuous carbonaceous mass. When the carbonaceous particles sinter together, the path for heat transfer is essentially a continuous carbon path having substantially no mechanical or non-carbon interfaces to traverse.

In one embodiment of the present invention, copper is used as the interstitial material. Copper is an ideal thermal conductor for making diamond heat spreaders. However, copper is not a carbon solvent and is not a catalyst for graphite to diamond conversion, nor does it act as a sintering aid at ultrahigh pressure. Hence, if copper is used as the interstitial material, it can also be done by electro-deposition or sintering. However, electro-deposition is extremely slow and inefficient in filling the pores among tightly packed diamond grains. Sintering, on the other hand, will inevitably leave pores in the copper and between copper and diamond. In either method, the carbonaceous particle packing efficiency in the final heat spreader is relatively low (e.g., 60% by volume).

Although copper is not a sintering aid to sinter carbonaceous particles together along carbonaceous grain boundaries, the ultrahigh pressure consolidation of a carbon-copper mixture can force carbonaceous grains closer together to reach a higher carbon content such as about 70% to about 90% by volume. Pressures may range from about 4 GPa to about 6 GPa. At these high pressures some of the carbonaceous particles are partially crushed to eliminate a portion of the voids between particles. In order to attain over 70% by volume of carbon without forming carbon-to-carbon bridges the excess copper must be extracted by a sink material. This sink material contains pores under ultrahigh pressure conditions and would not soften at the melting temperature of copper. Such a sink material may be made of a ceramic powder such as SiC, $Si_3N_4$, and $Al_2O_3$, but may also be formed of any porous material which provides a sufficient medium for absorbing the excess copper. Other useful porous materials include WC and $ZrO_2$. This technique may be further understood by reference to Example 1 below. In addition, although copper does not wet diamond, the molten copper can be injected into the diamond compact to substantially fill pores between diamond particles. Thus, in some embodiments, the heat spreader can be substantially free of voids or pores. Moreover, as the molten copper cools, it contracts slightly to provide an interconnected copper network which modestly compresses against diamond particles to provide tight interfacial contact. This tight interface contact substantially reduces thermal contact resistance between the copper and diamond, thus improving the thermal conductivity profile of the heat spreader.

In another aspect of the present invention, the interstitial material may be a carbon wetting infiltrating alloy with low percentage content by volume of the carbon wetting agent. In this manner, mechanical interfaces between carbon and the infiltrant are greatly reduced while providing an infiltrant with a relatively high thermal conductivity. For example, a good heat conducting metal such as Ag, Cu, or Al, may be alloyed with a carbide former such as Ti.

In addition to the benefits provided by including an infiltrating alloy with good conductivity and diamond wetting properties, the infiltrating alloy can be selected such that it has a relatively low eutectic melting point. In this manner the above-recited disadvantages associated with processing diamond particles at extremely high temperatures and pressures can be avoided. In one aspect, the eutectic melting point of the alloy used may be less than about 1100° C. In another aspect, the melting point may be less than about 900° C.

Examples of good carbide forming elements include without limitation, those recited above. Further, examples of materials having high heat conductivity include without limitation, Ag, Cu, and Al. A wide range of specific alloys may be used which attain the desired heat transfer and chemical bonding properties and also have a eutectic melting point within the temperatures specified above. However, in one aspect of the invention, the infiltrating alloy can include a carbide forming element and at least 1 wt % to about 10 wt % of either Ag, Cu, or Al. In another aspect, the carbide forming element is present in an amount of at least about 1% w/w of the heat spreader.

In another aspect, the infiltrating alloy can comprise a Cu—Mn alloy. The Cu—Mn alloy can be Cu—Mn(30%)-Ni(5%), which has a melting point of about 850° C., much lower than sintering temperatures used in the past. For example, Co, which has a melting point of about 1500° C., is often used as a sintering aid in HPHT processes used to form PCD compacts. As previously noted such temperatures endanger the integrity of the carbonaceous material and can cause degradation thereof. This is especially true for diamond particles. In contrast, processing diamond particles at relatively low temperatures of about 850° C. is much more desirable, from both an integrity standpoint and a process control and cost standpoint. In addition to those materials recited above, the infiltrating alloy used in the present invention can include a number of other materials. For example, in one aspect of the invention, Cu—Al—Zr(9%) and Cu—Zr(1%) can be used. While Zr is not a particularly good thermal conductor, its presence in the infiltrating alloy is relatively small by volume, and therefore does not significantly inhibit heat conduction through the heat spreader.

As a general guideline, using carbide forming metals can improve bonding of copper with diamond, however most carbide formers are thermal insulators. Thus, the degree of carbide bonding with diamond will typically be balanced and counteracted to a degree by thermal resistance.

By utilizing an infiltrating alloy which has a relatively low melting point and also has good wetting and conductivity properties, a superior carbonaceous heat spreader can be provided. The lower operating temperature results in lower operating pressures. By requiring lower operating pressures, the present invention can be utilized to form carbonaceous heat spreaders with far greater thickness than prior art methods, as it has been the extremely high pressures required to form PCDs that has limited the mold size used in the past. For instance, in one aspect, the present invention can be utilized to form heat spreaders with a thickness greater than about 1 mm. In another aspect, heat spreaders made in accordance with the present invention can have thickness as high as and exceeding about 2 mm. By forming the heat spreader with a greater thickness, the resulting heat spreader has the capacity to transfer or spread a greater volume of heat per unit time and therefore has a significantly greater cooling capacity.

Incorporation of Instant Heat Spreaders for Heat Removal

Heat spreaders made in accordance with the present invention may take a variety of configurations based on the intended use. The carbonaceous material made as described above may be polished and shaped based on the particular requirements of the heat source to which it will be applied. In contrast to CVD, the carbonaceous composites herein can be formed to almost any size relatively quickly. Most often for electronic applications the heat spreader will be between about 0.1 mm and about 1 mm thick. The heat spreader may be formed into a circular or elliptical disk or a quadrilateral such as a square, rectangular or other shaped wafer. The heat source may be any electrical or other component which produces heat.

Once the heat spreader is formed, appropriate placement is based on design and heat transfer principles. The heat spreader may be in direct intimate contact with the component, and may even be formed to encompass or otherwise be contoured to provide direct contact with the heat source over a wide surface area. Alternatively, the heat spreader may be removed from the heat source by a heat conduit or other heat transfer device.

Figure 1A:
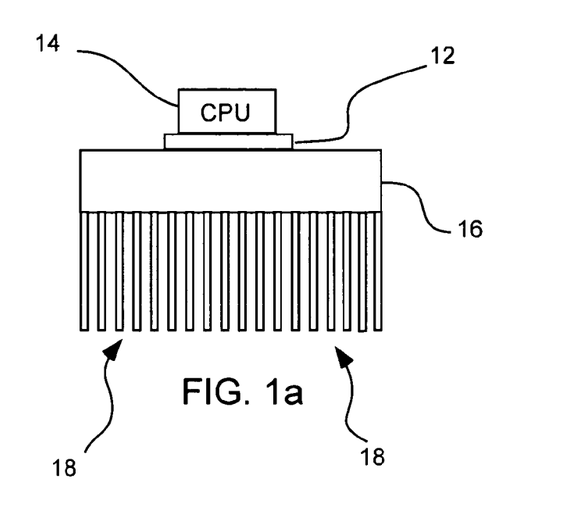
FIG. 1a is a schematic view of a heat spreader in thermal communication with a heat source and a heat sink in accordance with an embodiment of the present invention.

In addition to the heat spreader disclosed herein, the present invention encompasses a cooling unit for transferring heat away from a heat source. As shown in FIG. 1a, a heat spreader 12, formed in accordance with the principles discussed herein, can be disposed in thermal communication with both a heat source, such as a CPU 14, and a heat sink 16. The heat spreader transfers heat created by the CPU to the heat sink. The heat sink can be a number of heat sinks known to those of ordinary skill in the art including both the materials and configurations thereof. For example, aluminum and copper are well known for use as heat sinks, and as shown in FIG. 1a, can have a configuration that includes cooling fins 18. As heat is quickly and efficiently transferred from the CPU through the heat spreader, the heat sink absorbs the heat, and the cooling fins help dissipate the heat into the surrounding environment. A number of contact configurations between the heat sink, heat source, and heat spreader can be utilized depending on the specific results to be achieved. For example, the components may be disposed adjacent each other and can also be bonded or otherwise coupled to each other. In one aspect of the invention, the heat spreader can be brazed to the heat sink.

While the heat sink 18 is shown in the figures as a sink including cooling fins, it is to be understood that the present invention can be utilized with any heat sink known to those in the art. Examples of known heat sinks are discussed in U.S. Pat. No. 6,538,892, which is herein incorporated by reference. In one aspect of the invention, the heat sink comprises a heat pipe having an internal working fluid. Examples of heat pipe heat sinks are discussed in U.S. Pat. No. 6,517,221, which is herein incorporated by reference.

Figure 1B:
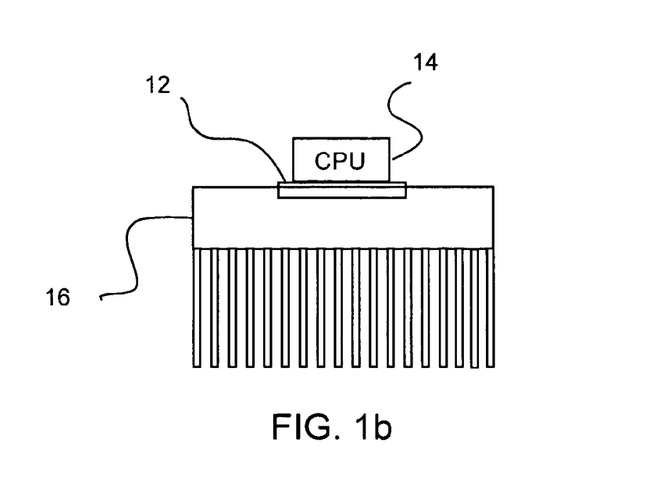
FIG. 1b is a schematic view of a heat spreader in thermal communication with a heat source and a heat sink in accordance with another embodiment of the present invention.

As shown in FIG. 1b, in one aspect of the invention, the heat spreader 12 can be at least partially embedded in the heat sink and/or the heat source. In this manner, not only is heat transferred from a bottom of the heat spreader to the heat sink, but heat is also at least partially transferred from sides of the heat spreader into the heat sink. After being embedded in the heat sink, the heat spreader can be bonded or brazed to the heat sink. In one aspect, the heat spreader can be held in the heat sink by a compression fit. In this manner, no bonding or brazing material exists between the heat spreader and the heat sink, which might act as a barrier to efficient heat transfer from the spreader to the sink.

While the heat spreader can be held in the heat sink by a variety of mechanisms known to those skilled in the art, in one aspect the heat spreader is held in the heat sink by a thermally induced compression fit. In this embodiment, the heat sink can be heated to an elevated temperature to expand an opening formed in the heat sink. The heat spreader can then be fitted into the expanded opening and the heat sink can be allowed to cool. Upon cooling, the heat sink, which has a relatively high coefficient of thermal expansion, will contract around the heat spreader and create a thermally induced compression fit that holds the heat spreader embedded within the heat sink without requiring any intervening bonding material. A mechanical friction fit can also be utilized to hold the heat spreader in the heat sink.

Figure 1C:
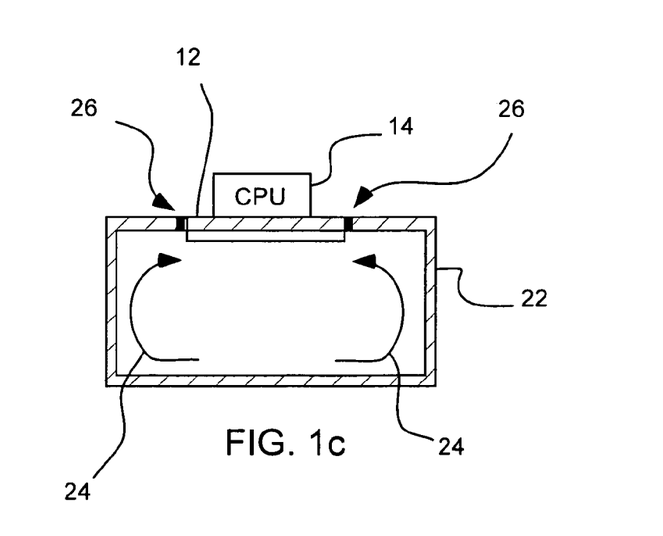
FIG. 1c is a schematic view of a heat spreader in thermal communication with a heat source and a heat sink in accordance with another embodiment of the present invention.

As shown in FIG. 1c, in one aspect of the invention, the heat sink can comprise a heat pipe 22 which can have an internal working fluid (not shown). The internal working fluid can be any known to those in the art, and in one aspect is water or water vapor. The heat pipe can be substantially sealed to maintain the working fluid within the heat pipe. The heat spreader can be disposed adjacent the heat pipe and in one aspect is brazed to the heat pipe. In the embodiment shown in FIG. 1c, the heat spreader protrudes through a wall of the heat pipe so that a bottom of the heat spreader is in direct contact with the working fluid. The heat spreader can be brazed within the heat pipe, as shown at 26, to assist in maintaining the substantially sealed condition of the heat pipe.

As the heat spreader is in direct contact with the working fluid, the working fluid can more efficiently transfer heat from the heat spreader. In the embodiment shown in FIG. 1c, the working fluid, in this case water (not shown), contacts the heat spreader and becomes vaporized as it absorbs heat from the heat spreader. The water vapor can then condense in liquid form on the bottom of the heat pipe, after which, due to capillary forces, the liquid will migrate 24 back up the walls of the heat pipe to the heat spreader, where it will again vaporize and repeat the cycle. As the walls of the heat pipe can be made of a material with a high coefficient of thermal conductivity, heat is dissipated from the walls of the heat pipe into the surrounding atmosphere.

As mentioned above, the packed carbonaceous particles, especially diamond, may also be sintered together to form a mass of substantially sintered particles having largely only carbon. When the carbonaceous particles are sintered together there are carbon bridges connecting neighboring carbon particles. The above-described packing methods can increase the original carbon packing efficiency. By packing different size carbonaceous particles in successive stages the packing efficiency may be increased up to about 80% by volume. However, because there is no carbon-to-carbon bonding, the packing efficiency reaches a limit. Hence, in order to further increase the packing efficiency and the thermal conductivity, carbonaceous particles must be sintered together. In addition, when the carbonaceous particles are sintered together such that there are carbon bridges connecting neighboring carbonaceous particles an uninterrupted path for heat flow is provided. In this way, heat can pass through the carbonaceous heat spreader rapidly without being slowed down at interfaces between individual particles which are merely in intimate contact.

In order for diamond particles to sinter together, they must be heated in the stability region of diamond; otherwise, diamond will revert to the more stable form of graphite. U.S. Pat. Nos. 3,574,580; 3,913,280; 4,231,195 and 4,948,388 discuss this process in more detail and are all incorporated herein by reference. Diamond sintering is generally performed at very high pressures. Typically, pressures of more than about 4 GPa up to about 8 GPa are required, although a few processes have sought to lower this pressure requirement, e.g., U.S. Pat. No. 4,231,195. More typical sintering pressure is about 5 to about 6 GPa. At such pressures, diamond particles sinter together by a mechanism known as liquid phase sintering.

An interstitial material may be provided which acts as a diamond, or carbonaceous particle, sintering aid. During this process, an interstitial material (e.g., Fe, Co, Ni, Si, Mn, and Cr) can wet the diamond particles. The diamond will dissolve into this interstitial material because of increased solubility at these pressures. The local pressure is higher at the contact points of the diamond particles, so diamond particles will dissolve first at these points. In contrast, the pressure in the original voids between diamond particles is low so the dissolved diamond in the form of carbon atoms in the molten liquid will precipitate out as diamond in the voids. Hence, the contacting points of diamond will gradually dissolve and the voids between the diamond particles will gradually fill with precipitated diamond. The consequence is to bring diamond particles closer beyond the original contact point and the substantial elimination of the original voids to produce a diamond structure having a composition between about 70% and about 98% by volume of diamond. In addition, unlike with the low-pressure processes described above the diamond particles will not experience any degradation because the conditions of temperature and pressure are within the stability region of diamond.

The final product of ultrahigh pressure sintering of diamond is a polycrystalline diamond (PCD) with remnant diamond grains sintered together. In such a structure, the outlines of the original diamond particles are largely lost and instead prominent diamond-to-diamond bridges are formed. If diamond sintering can be performed near completion, the entire mass will be made of diamond with small pockets of non-diamond material trapped in the original voids inside the PCD. Such a structure may contain over 95% by volume of a continuous framework of diamond and hence it is highly efficient in conducting heat and approaches the thermal properties of pure diamond.

This ultrahigh pressure process may also be applied to carbonaceous composite heat spreaders made by sintering of metal together at a lower pressure (<2 GPa) as in the case of hot pressing mentioned above. The ultrahigh pressure process may also be used to consolidate carbonaceous composite heat spreaders to increase the carbon content beyond what can be achieved by hot pressing alone.

Interstitial materials suitable for the ultrahigh pressure production of heat spreaders according to the method of the present invention include Si, Ti, Fe, Co, Ni, Cu, Mn, W, La, Ce, and mixture or alloys of these materials. Not all of these materials act as a sintering aid.

In another aspect of the present invention, a sink material such as a ceramic is provided to accelerate the removal of the sintering aids. As described above, this sink material is porous and does not soften at the ultrahigh pressures used in sintering of the diamond particles. Such sink materials are most often ceramic powders such as SiC, $Si_3N_4$, and $Al_2O_3$, but may be any porous medium which can act to absorb excess sintering aid material. Other useful porous materials include WC and $ZrO_2$.

In addition to the above-recited systems and devices, the present invention also provides a method for making a heat spreader, and can include the steps of providing a plurality of carbonaceous particles, and infiltrating the plurality of carbonaceous particles with a non-carbonaceous infiltrant as recited in the various aspects described above, such that a heat conducting mass is formed. In another aspect, a method of cooling a heat source is provided and includes the steps of providing a heat spreader as recited in the various aspects described above, and placing the heat spreader in thermal communication with both the heat source and a heat sink.

Thermal Conductivity Gradients

Diamond composite heat spreaders of the present invention can also include a diamond-containing material which is specifically designed to distribute heat in a controlled manner by providing a variable thermal conductivity gradient throughout the diamond-containing material. The variable thermal conductivity gradient can be provided in a number of ways. Thermal conductivity is a function of the specific material and any boundaries along a given thermal heat transfer path. Therefore, as the material changes in composition, the thermal conductivity is likely to change as well. In context of the present invention, the most salient variables which can affect thermal conductivity gradients include diamond volume concentration, mean free thermal path, and impurities. As a general matter, an increased diamond volume concentration often corresponds to higher overall thermal conductivity. However, two different compositions including diamond particles of highly different average particle sizes may not have the same thermal conductivity, even though the diamond volume concentration is the same. Specifically, as average particle sizes decrease, the number of boundaries between diamond to diamond and from diamond to non-carbonaceous materials also increases. Thus, along any particular path of heat transfer, heat must cross a greater number of solid-solid boundaries. These boundaries present significant additional thermal contact resistance which decreases the thermal conductivity in regions having greater numbers of such boundaries. The mean free thermal path is therefore a measure of the average distances along heat transfer paths through diamond which do not include a solid-solid boundary. In regions where a higher thermal conductivity is desired, diamond particles having increased particle sizes or a solid diamond film can be used. Conversely, in order to reduce thermal conductivity in a particular region, the average particle size can be reduced. However, both the diamond volume concentration and the mean free thermal path affect the thermal conductivity profile to a greater or lesser degree depending on the specific composition.

Typically, heat can disperse throughout a heat spreader in nearly all directions away from a heat source; however, the heat tends to flow along a thermal path of least resistance along which heat will preferentially flow towards outer surfaces of the heat spreader. In accordance with an embodiment of the present invention, the diamond-containing material can be configured to have a relatively higher thermal conductivity at a heat input region near the heat source and progressively lower thermal conductivity in regions remote from the heat source.

In accordance with another embodiment of the present invention, heat can be specifically directed substantially along a predetermined path, or paths, of the heat spreader based on changes in thermal conductivity. Thus, a heat spreader can be configured to selectively direct heat along a predetermined path characterized by higher thermal conductivity than surrounding areas of diamond-containing material. Thus, although the entire heat spreader can be directing heat away in nearly all directions, a preferred direction will direct a disproportionate amount of heat along the predetermined path. It will be obvious to those skilled in the art that heat gradients will occur throughout the heat spreader and heat transfer is not limited to a single path but is rather a continuum of temperature gradients in all directions with varying profiles depending on the thermal conductivity and thermal resistances across any particular direction.

The diamond-containing material can be the diamond composite materials of the present invention as described above in detail. However, other known diamond heat spreaders containing high diamond content can be used. The thermal conductivity gradient of the heat spreader can be optimally configured to evenly distribute heat flow across the entire heat spreader, wherein discontinuities or abrupt changes in the temperature profile and thermal conductivity are minimized. However, variations such as those depicted in FIGS. 2 through 7 can be used which balance costs of production with theoretically optimal thermal conductivity gradients. Further, a desirable thermal conductivity gradient can affect a decrease in the temperature gradient. Thus, a preferred thermal conductivity profile minimizes thermal resistance, while lowering the overall temperature gradient. In this way, although the heat spreader also quickly conducts heat away from a heat source, the heat spreader can also be maximized in terms of overall capacity to temporarily hold heat.

In designing various diamond-containing materials, the variable thermal conductivity gradient can substantially decrease from a heat influx region to a heat exit region of the diamond-containing material. The change in thermal conductivity can vary greatly. Typically, the thermal conductivity can vary from about 1% to about 80% from the heat influx to the heat exit region, and preferably from about 10% to about 60%. However, it will be understood that these ranges are merely guidelines, with the exception that, as used in this context, the term "substantially" is intended to exclude mere fluctuations in thermal conductivity resulting from minor variations in composition inherent in uniform or nearly uniform compositions.

Additionally, in determining a desirable thermal conductivity gradient, consideration can be given to the heat source(s). A desired predetermined temperature profile can be identified. In accordance with the present invention, the heat spreaders can be designed in order to achieve a given cooling effect and to approximate the desired temperature profile during use.

Figure 2:
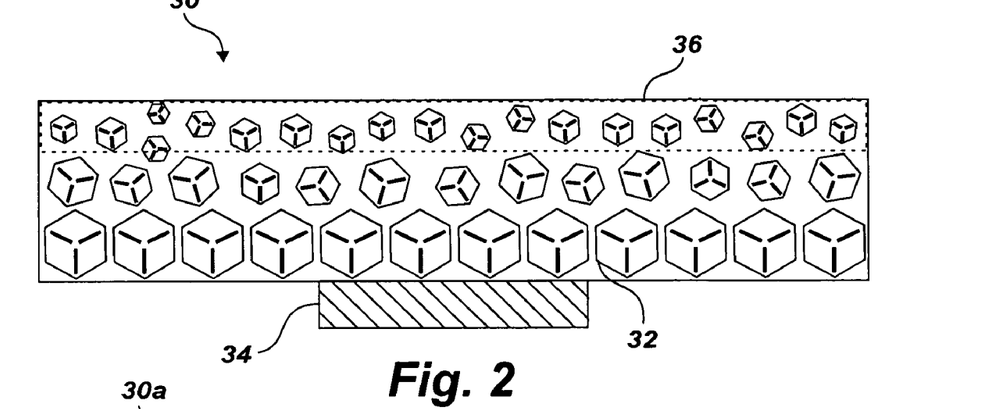
FIG. 2 is a side cross-sectional view of a heat spreader adjacent a heat source in accordance with an embodiment of the present invention.

Referring now to FIG. 2, a diamond composite heat spreader 30 is shown having a diamond-containing region which corresponds to substantially the entire heat spreader. The heat influx region 32 can be proximal to a heat source 34 to which the heat spreader is design to be attached. A heat exit region 36 can be distal to, or remote to, the heat source.

In some embodiments, the thermal conductivity gradient can be substantially determined by variations in volume concentration of diamond. Variations in diamond concentration can be a substantially continuous decrease in the diamond concentration from the heat influx region to the heat exit region. Alternatively, variations in concentration can be a plurality of discrete regions each having a different concentration of diamond particles, as shown in FIGS. 2 through 6. Typically, each region has a lower concentration of diamond particles than an adjacent region which is nearer the heat influx region. Further, any number of regions can be designed for a particular heat spreader. In some embodiments, the heat influx and heat exit regions can comprise substantially all of the heat spreader. However, in other embodiments multiple regions can be oriented between the heat influx and heat exit regions in order to provide a controlled gradation of thermal conductivity throughout the heat spreader. Similarly, variations in thermal conductivity, diamond concentration, and/or diamond particle sizes can be formed radially, or horizontally, along the diamond-containing material.

In additional embodiments, the thermal conductivity gradient can be determined or substantially governed by providing a plurality of regions having a varying mean free thermal path across diamond-containing material. Varying the mean free thermal path can be accomplished by varying the average diamond particle size along the thermal conductivity gradient. Thus, each region can have a smaller average diamond particle size than an adjacent region which is nearer the heat influx region.

In addition, the heat spreader can be configured to remove heat from a plurality of heat sources. Similarly, a plurality of heat exit regions can be designed to substantially direct heat along a given thermal path, as discussed above. Further, it should be noted that although the figures are two-dimensional, actual heat spreaders will be three-dimensional. Thus, the thermal conductivity gradient can be adjusted in all three dimensions in order to control heat transfer throughout the heat spreader in accordance with the principles of the present invention.

Figure 3:
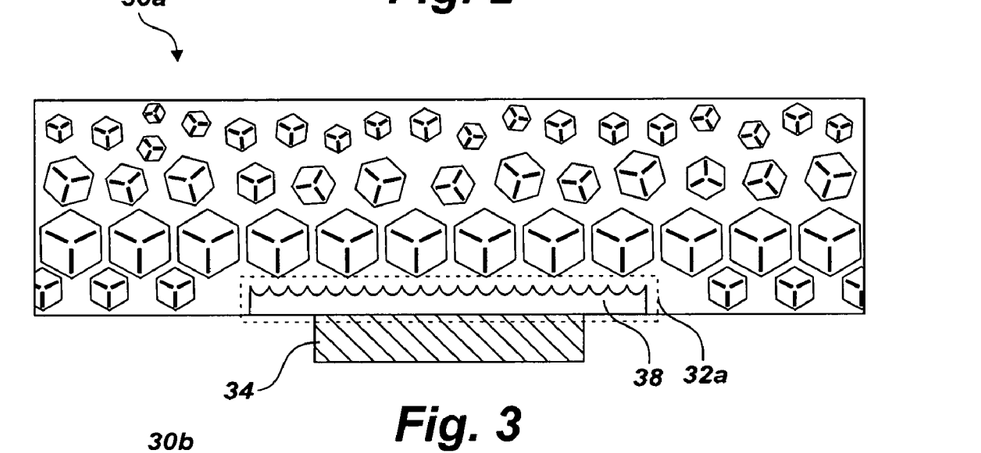
FIG. 3 is a side cross-sectional view of a heat spreader including a diamond film adjacent a heat source in accordance with another embodiment of the present invention.

Referring now to FIG. 3, a diamond film 38 can be formed adjacent the particulate diamond region. The diamond film can be formed by depositing diamond film directly on a surface of the particulate diamond region via chemical vapor infiltration. As is well known in the art, diamond films can be formed via CVD or other similar processes to form pure diamond film, amorphous diamond, diamond-like carbon, or the like. Those skilled in the art can determine conditions required to achieve various diamond films. During formation of a diamond film on a porous surface chemical vapor infiltration (CVI) typically occurs. During CVI, the deposited diamond tends to initially form diamond in the interstitial voids of the diamond particulate region near the surface. Thus, the diamond film is partially integrated into the surface of the particulate diamond region. This helps to decrease the thermal contact resistance along the boundary between the diamond film and the particulate diamond region. Further, this gradual change in composition provides a smoother thermal conductivity gradient than would occur with a distinct boundary.

Figure 4:
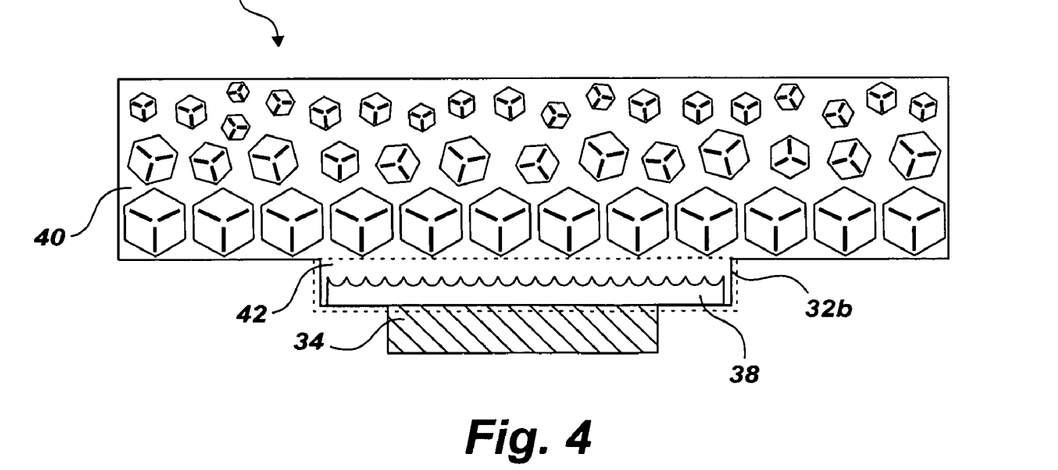
FIG. 4 is a side cross-sectional view of a heat spreader including a diamond film adjacent a heat source in accordance with yet another embodiment of the present invention.

Alternatively, a diamond film can be formed separate from the particulate diamond region and then brazed to a surface of the particulate diamond region. For example, FIG. 4 illustrates a diamond film 38 which is brazed to the particulate diamond region 40 via a braze layer 42. Brazing in this manner can be desirable in some embodiments, although the thermal conductivity profile tends to include more abrupt changes than in the CVI embodiment. However, the braze material can typically partially fill adjacent interstitial voids in the particulate diamond region. Any suitable braze material can be used. However, the thermal resistance of this braze layer can be minimized by using a braze having a high thermal conductivity and/or by providing a very thin layer, e.g., a few microns, which is generally sufficient under low mechanical stress conditions associated with heat spreaders. Non-limiting examples of suitable braze materials include Ag—Cu—Ti alloys, Au—Ta alloys, and alloys such as those previously described.

One advantage of using a diamond film in connection with the present invention is that diamond films have extremely good thermal conductivities, e.g., typically approaching that of pure diamond (2400 W/mK), but are expensive and time consuming to produce an effective heat spreader. However, when used in conjunction with particulate diamond regions as described herein, the thickness of the diamond film can be reduced. For example, in some embodiments, the diamond film can have a thickness of from about 0.1 mm to about 1 mm, such as from about 0.3 mm to about 0.7 mm, and preferably about 0.5 mm. In this way, the high thermal conductivity of diamond film can quickly remove heat from a heat source while the adjacent particulate diamond region then transfers the heat further away from the heat source at a somewhat lower, but still relatively high rate. This is particularly beneficial when cooling many electronic components, e.g., CPUs, where high temperatures are only temporary and fluctuate over time. Thus, a thin diamond film layer can be provided which is sufficient to transfer heat toward the particulate diamond region without sacrificing removal of heat from the heat source. In embodiments including a diamond film, the heat influx region can have a thermal conductivity up to 2400 W/mK and the heat exit region can have a thermal conductivity from about 200 w/mK to about 2000 W/mK, and typically from about 500 W/mK to about 1000 W/mK.

Figure 5:
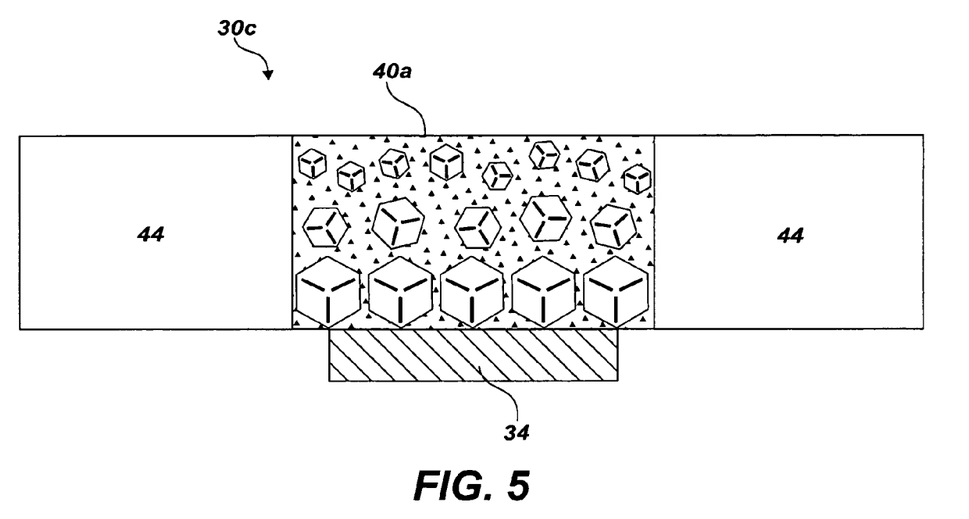
FIG. 5 is a side cross-sectional view of a heat spreader including a non-carbonaceous mass around a diamond-containing region in accordance with an embodiment of the present invention.
Figure 6:
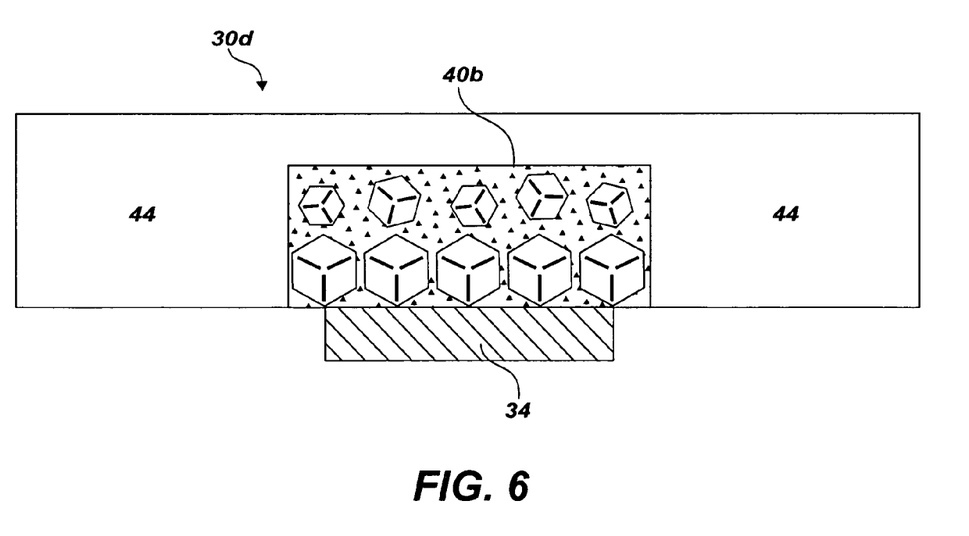
FIG. 6 is a side cross-sectional view of a heat spreader including a non-carbonaceous mass around a diamond-containing region in accordance with another embodiment of the present invention.

Referring now to FIG. 5, a heat spreader 30c can include a non-carbonaceous mass 44. Specifically, the diamond-containing material 40a can be interference fitted into a non-carbonaceous mass. The non-carbonaceous mass preferably has a high thermal conductivity such as, but not limited to, copper, oxygen free high conductivity (OFHC) copper, silver, aluminum, gold, alloys of these metals, and the like. In one embodiment, the non-carbonaceous mass is OFHC copper. Similarly, FIG. 6 illustrates an embodiment wherein the non-carbonaceous mass 44a has a recessed portion into which the diamond-containing material 40b can be placed.

Table 2 lists several thermal properties of materials used in connection with the present invention. Note that the DiaCu (trademark of Kinik Company) is an embodiment of the present invention having substantially homogeneous composition and thermal conductivity throughout where the actual diamond to copper ratio is about 9; however, due to crystal defects and impurities the effective ratio is only about 3.7. It is interesting to note that unlike metals, diamond conducts heat via lattice vibration rather than electron movement. Therefore, imperfections and defects in the diamond lattice disrupt optimal lattice vibration. Thus, although the theoretical properties are much higher, the measured properties resulted in a diamond-containing heat spreader material having a thermal conductivity only about twice that of copper. Typically, materials formed having a variable thermal conductivity gradient will exhibit an overall thermal conductivity somewhere between that of pure diamond and the DiaCu product, although the actual performance for a particular heat source can be even greater due to the variations in thermal conductivity as discussed above.

TABLE 2

| Material | Thermal Conductivity W/mK | Thermal Diffusivity ($cm^2$/sec) | Heat Capacity (J/KgK) | Density ($g/cm^3$) |
|---|---|---|---|---|
| Diamond | 2400 | 12.7 | 540 | 3.52 |
| DiaCu | 800 | 4.29 | 486 | 4.00 |
| Cu | 400 | 1.16 | 385 | 8.96 |
| Diamond/Cu ratio | 6.0 | 11 | 1.4 | 0.39 |

* Thermal conductivity can be calculated as a product of thermal diffusivity, heat capacity, and density.

Figure 7:
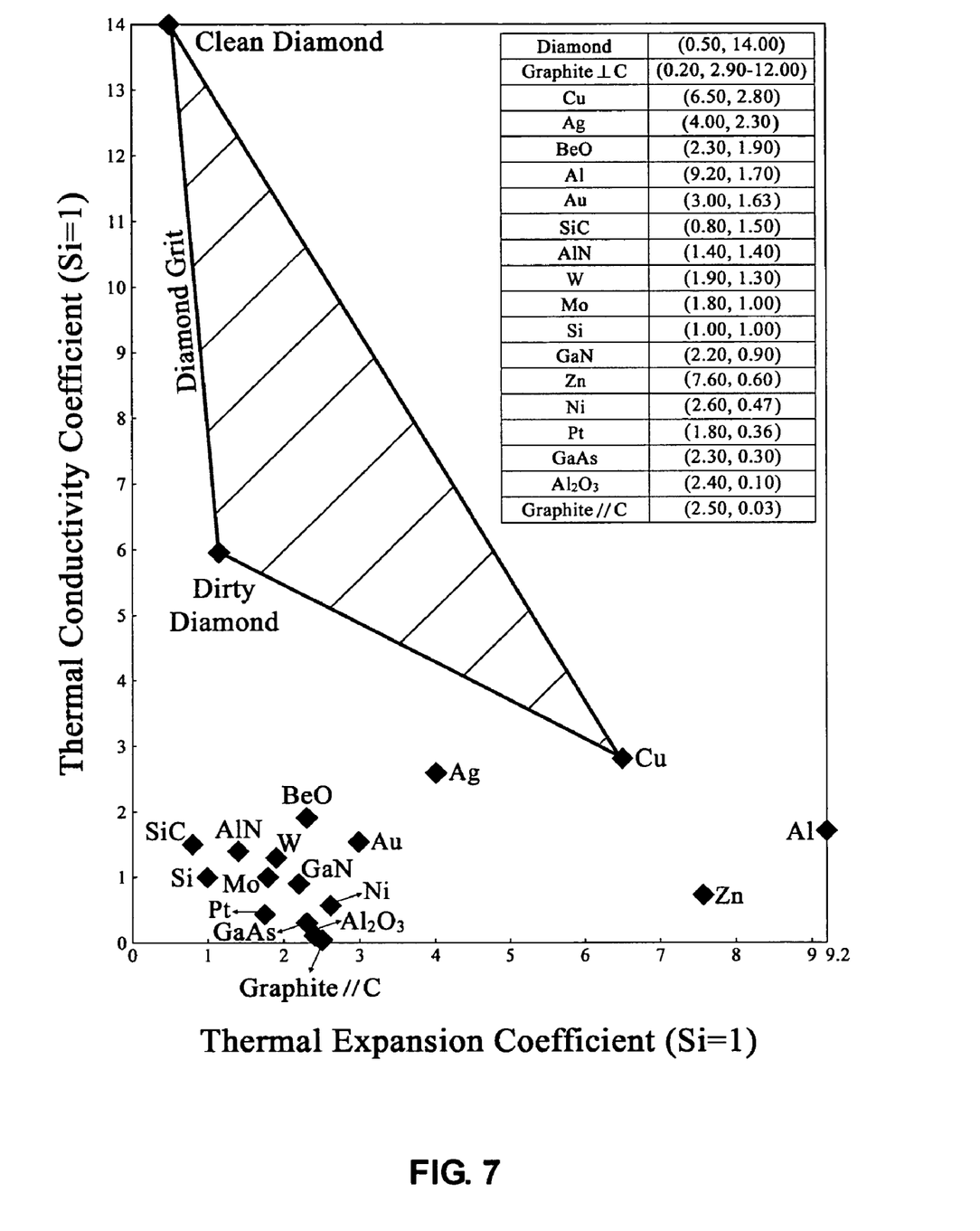
FIG. 7 is a graph of thermal expansion coefficient versus thermal conductivity coefficient for several materials.

In addition to the above considerations, thermal expansion can affect the choice of potential materials for use in the present invention. For example, FIG. 7 illustrates thermal expansion coefficients versus thermal conductivity coefficients for several potentially useful materials. The enclosed triangular region represents the approximate region over which most of the diamond composite and diamond-containing materials of the present invention fall. Preferably, any materials such as interstitial material, braze, or any adjacent layers can have a thermal expansion coefficient which is substantially similar to the diamond materials. Specifically, a large difference in thermal expansion can cause unnecessary fatigue and stress within the diamond materials during use. With respect to nomenclature, "graphite ⊥ c" refers to the property of graphene planes perpendicular to the "c" crystallographic axis, while "graphite//c" refers to the property parallel to the "c" crystallographic plane. This highlights the anisotropic nature of graphite. Also, the values of thermal conductivity and thermal expansion are normalized with respect to silicon for convenience in matching the materials of the present invention for use with silicon devices.

The diamond-containing material of the present invention can be formed in a variety of ways. The methods discussed above in connection with diamond composites having a substantially homogenous composition can also be applied to diamond-containing material having varied concentrations and/or particle sizes of diamond. For example, a plurality of diamond particles can be packed in a predetermined pattern characterized by varying diamond particle sizes to form a diamond particulate region. Packing of diamonds in a predetermined pattern can be accomplished by placing a first layer of diamond particles in a mold and then placing one or more additional layers of diamond particles adjacent one another such that each successive additional layer of diamond particles has a progressively smaller average diamond particle size than the first layer. Alternatively, layers having smaller diamond particles can be first packed followed by successively larger particles. In either case, there can be some partial filling of interstitial spaces between adjacent layers of different size particles depending on relative particle sizes of adjacent layers.

In another alternative embodiment, a plurality of layers can be formed having different average particle sizes, such that each layer is formed via the successive packing method described above in order to achieve high packing efficiencies. For example, a first plurality of diamond particles having a first average mesh size can be packed. Typically, these packed diamonds will have interstitial voids between particles. Successively smaller particles can then be packed into the interstitial voids in the first plurality of diamond particles to form a first diamond particle region. This process can then be repeated with successively smaller diamond particles as desired to form multiple packed regions each having a plurality of different particle sizes. Thus, the diamond-containing material can have a high volume concentration of diamond throughout, which improves the local and overall thermal conductivities.

The following examples present various methods for making the heat spreaders of the present invention. Such examples are illustrative only, and no limitation on the present invention is meant thereby.

EXAMPLES

Example 1

Diamond particles of 50/60 U.S. mesh are mixed with powdered copper to form a mixture. This mixture is then cold pressed to form a slug. A thin walled mold made of a refractory metal (e.g., Ti, Zr, W, Mo, and Ta) is provided. Ceramic particles (e.g., SiC, $Si_3N_4$, $Al_2O_3$) having a coarse grain size (e.g., 40/50 mesh) are first put in the mold and then the ceramic particles are covered with the diamond-copper slug. The sample assembly is then placed in a high-pressure cell and pressurize to over 5 GPa. The assembly is then heat charged to over 1200° C. by passing an electric current through a heating tube that surrounds the sample assembly. At this temperature and pressure, copper melts and is forced out from between the diamond particles. The liquid copper flows to the bottom of the mold containing the ceramic particles. The ceramic particles contain ample empty pores to receive the liquid copper. In this way the diamond grains are partially crushed and substantially fill in the space left by the copper. The result is a high diamond content (e.g., 85% by volume) heat spreader. A portion of the copper remains in the composite material and is bonded to the diamond to hold the particles together, including on both sides of the diamond heat spreader.

Because of the lack of diamond-to-diamond bridges, the copper cemented diamond composite described above does not reach a diamond content of up to 95% by volume of sintered diamond as in PCD, but its diamond content is much higher than would be produced by electro-deposition or hot-pressing. Hence, the thermal conductivity would be much higher than the low-pressure diamond composite heat spreaders of the present invention. Moreover, the high thermal conductivity of copper partially compensates for the lower diamond content (about 85% by volume) when compared to PCD as the latter contains carbon solvent metals, e.g., Co, that have much lower thermal conductivities than copper.

PCD has been made routinely, but is typically designed and used exclusively for mechanical functions, such as cutting tools, drill bits, and wire drawing dies. In order to improve the mechanical finish and to increase the mechanical strength (e.g., impact strength), PCD is made of very fine diamond powder. The best PCD contains very fine diamond particles such as sub-micrometer sizes (e.g., manufactured by Sumitomo Electric Company of Japan). By utilizing PCD in a heat spreader, mechanical properties become less important. Instead of impact strength and surface finish, the diamond packing efficiency and thermal properties are the primary concern. Thus, the design of PCD for heat spreaders is distinct from that of conventional abrasive applications. Specifically, the diamond particles of the present invention are relatively large grain sizes, and the infiltrant or sintering aid requires high thermal conductivity rather than mechanical toughness as in conventional PCD.

In order to improve the heat transfer efficiency of the heat spreader the grain boundaries of diamond particles are minimized, this is in contrast to a conventional design of diamond composites where the grain boundaries are maximized to facilitate sintering. The use of larger diamond particles not only reduces the grain boundaries that reduce heat transfer, but also serves to increase the diamond packing efficiency and further increase the thermal conductivity. Hence, this design criterion is applicable to all diamond and diamond composite heat spreaders described herein.

Example 2

A contact cavity in the form of a circular hole having a diameter of about 20 mm is formed into a flat base of an aluminum heat sink with radiating fins cooled by a fan. The contact cavity is coated with a thermal grease and includes a pin hole near the center of the cavity. The heat sink is heated to a temperature of about 200° C. to expand the contact cavity, after which a diamond composite heat spreader with a diameter of about 20 mm is inserted into the contact cavity. The pin hole ensures that no air is trapped between the heat spreader and heat sink and allows for excess thermal grease to be extruded therethrough. Upon cooling, the much larger thermal expansion contraction of the aluminum heat sink will result in the diamond composite heat spreader being firmly compressed into the contact cavity. The top surface of the diamond composite heat spreader is ground to remove any debris formed by the shrink fitting. The heat spreader is placed in contact with a chip or CPU and heat is spread through the heat spreader and into the heat sink, with heat spreading from both the bottom of the heat spreader and the sides of the heat spreader into the heat sink.

Example 3

50/60 U.S. mesh diamond particles were acid cleaned and loaded in a tatalum cup having a cylindrical shape. An OFHC copper disk was placed on top of the diamond particles. The charge was pressurized to 5.5 GPa in a 2000 ton cubic press that utilizes 6 anvils pressing toward a pyrophllite cube that contained the charge. Electrical current was passed through a graphite tube that surrounds the charge. At a temperature of 1150° C., molten copper was infiltrated through the diamond particles. Upon cooling and decompression, the charge was ground to remove the tantalum container and also the top and bottom surfaces of the diamond-copper composite. The final disk was 50.8 mm in diameter and 3 mm thick. The diamond content was approximately 90 vol %. Over 200 diamond composite heat spreaders were produced, resulting diamond-copper heat spreaders having a heat transfer rate of about 1.5-2.5 times that of pure copper.

Example 4

A heat spreader is made in accordance with Example 3, except that Cu—Zr in a concentration of about 1 wt % is used to improve the wetting characteristics of copper and diamond.

Example 5

A heat spreader is made in accordance with Example 3, except a Cu—Ag alloy is used to increase the thermal conductivity of the matrix material.

Example 6

A thin foil of graphite (available from Graftech International Ltd. as GRAFOIL) is placed in an alumina container and is covered with 30/40 diamond crystals. The crystals are pressed into the grafoil by using a flat plate. Ag—Cu—Sn—Ti foil is placed on top of diamond/grafoil combination. The assembly is heated in a vacuum furnace at 950° C. for 15 minutes. The result is an alloy infiltrated diamond-graphite.

Example 7

30/40 mesh diamond particles (about 500 micrometers) are mixed with bronze powder (about 20 micrometers) to achieve a volume efficiency of 50%. The mixture is hot pressed in a graphite mold to a pressure of 40 MPa (400 atmospheric pressure) and heated to 750° C. for 10 minutes. The result is a diamond metal composite disk of 30 mm in diameter and 3 mm in thickness.

Example 8

An amount of 30/40 mesh diamond particles are mixed with aluminum powder and loaded in an alumina tray. The charge is heated in a vacuum furnace of $10^{-5}$ torr to 700° C. for 5 minutes so the aluminum becomes molten. After cooling, the result is a diamond aluminum composite.

Example 9

30/40 mesh diamond is placed inside a graphite mold and covered with NICROBRAZ LM (Wall Colmonoy) powder of about 325 mesh. The load is heated in a vacuum furnace of $10^{-5}$ torr to 1010° C. for 12 minutes. The molten Ni—Cr alloy infiltrated into diamond particles to form a diamond metal composite.

Example 10

30/40 mesh diamond is placed inside a graphite mold and covered with broken silicon wafers. The load is heated in a vacuum furnace of $10^{-5}$ torr to 1470° C. for 9 minutes. The molten Si infiltrated into diamond particles to form a composite.

Example 11

30/40 mesh diamond is placed inside a graphite mold and then agitated. 220/230 mesh diamond is then placed in the mold and gently agitated until most of the voids are filled with the smaller particles. The packed diamond is then covered with NICROBRAZ LM (Wall Colmonoy) powder of —325 mesh. The load is heated in a vacuum furnace of $10^{-5}$ torr to 1,010° C. for 12 minutes. The molten Ni—Cr alloy infiltrated into diamond particles to form a diamond metal composite.

Example 12

30/40 mesh diamond is packed around a cathode and immersed in an acid bath that contains copper ions. After the current passes through, copper is gradually deposited in the pores of these diamond particles. The result is a diamond copper composite.

Example 13

20/25 mesh diamond particles (SDA-100S made by De Beers) substantially cubic in shape were aligned edge to edge on an alumina plate to form a single layer of diamond particles about 40 mm square. A silicon wafer of 0.7 mm in thickness was placed on top of this layer of particles. The assembly was then placed in a vacuum furnace and pumped down to $10^{-5}$ torr. The temperature was then raised to 1,450° C. for 15 minutes. The silicon melted and infiltrated between the diamond particles. After cooling, the composite was machined to eliminate excess silicon. The result is a diamond heat spreader of about 0.8 mm. This heat spreader contains a diamond volume of about 90%. The use of substantially cubic particles allows a much higher diamond content than can be conventionally achieved using the successive packing method described earlier.

Example 14

40/50 mesh diamond particles are mixed with a mixture of Si and Ti powders and the entire mixture is loaded inside a graphite mold that is in turn fitted inside a titanium heating tube. The assembly is placed at the center of a pyrophyllite block. This block is mounted in a cubic press and it is subjected to a pressure of 5.5 GPa. Heating is achieved by passing electrical current through the titanium tube. When the silicon melts it dissolves titanium and both flow around the diamond particles. Diamond particles then sinter with the aid of the silicon liquid. After quenching and decompression, the diamond composite is separated from the pyrophillite and other pressure medium. The result is a diamond composite that contains about 92% by volume of diamond. Twenty such diamond composites are made each with dimensions of 20 mm in diameter and 3 mm in thickness. These diamond composite disks were polished by diamond wheels and measured for thermal conductivity that indicates a value of about twice that of copper.

Example 15

A diamond film 0.5 mm in thickness and about 5 mm in diameter is placed at the center bottom of a refractory metal cup having a 20 mm diameter. A 1 mm thick first layer of 20/30 mesh diamond particles is placed on top of and around the diamond film. A 1 mm thick second layer of 50/60 mesh diamond particles is placed on top of the first layer. A 1 mm thick third layer of 80/100 mesh diamond particles is placed on top of the second layer. The assembly is then infiltrated with molten OFHC copper under vacuum with a dead weight. The resulting diamond composite heat spreader has a thermal conductivity gradient having an approximate stepwise profile along the heat spreader thickness.

Example 16

The same procedure is followed as in Example 14; however the diamond film and diamond particles are pre-coated with a 1 μm thick layer of titanium to improve bonding of the copper infiltrant.

Example 17

The same procedure is followed as in Example 14; however no diamond film is included. The infiltrated diamond composite is then subjected to CVI to form a diamond film 0.1 mm thick adjacent the first layer. This heat spreader is then interference fitted around its circumference within an OFHC copper ring to produce a heat spreader having a variable thermal conductivity gradient.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method of making a heat spreader, comprising the steps of:
    a) defining a heat spreader volume;
    b) identifying a desired predetermined temperature profile within the heat spreader volume based on an intended heat source; and
    c) forming a diamond-containing material within the heat spreader volume having a variable thermal conductivity gradient configured to produce approximately the predetermined temperature profile during use, wherein the variable thermal conductivity gradient substantially decreases from a heat influx region to a heat exit region of the diamond-containing material, said thermal conductivity gradient being determined by providing a plurality of regions having a varying mean free thermal path across diamond material, wherein the varying mean free thermal path is determined by varying average diamond particle size along the thermal conductivity gradient.

2. The method of claim 1, wherein the intended heat source is a CPU.

3. The method claim 1, further comprising forming the heat influx region of a diamond film.

4. The method of claim 1, wherein the thermal conductivity gradient is affected by variations in volume concentration of diamond.

5. The method of claim 4, wherein the variations in volume concentration of diamond are within the range of about 30% to about 95% by volume diamond.

6. The method of claim 1, wherein the step of forming the diamond-containing material includes packing a plurality of diamond particles in a predetermined pattern characterized by varying diamond particle sizes to form a diamond particulate region.

7. The method of claim 6, wherein packing is accomplished by placing a first layer of diamond particles in a mold and then placing one or more additional layers of diamond particles adjacent one another such that each successive additional layer of diamond particles has a progressively smaller average diamond particle size than the first layer.

8. The method of claim 6, wherein the step of forming further includes infiltrating the diamond particulate region with a non-carbonaceous material.

9. The method of claim 6, wherein the step of forming further includes sintering the particulate diamond region.

10. The method of claim 6, wherein packing results in substantially each diamond particle being in contact with at least one other diamond particle.

11. The method of claim 6, wherein a first plurality of diamond particles having a first average mesh size is packed and then packing successively smaller particles into interstitial voids in the first plurality of diamond particles to form a first diamond particle region.

12. The method of claim 11, wherein packing further comprises forming a second particle region by placing a second plurality of diamond particles adjacent the first diamond particle region and then packing successively smaller particles into interstitial voids in the second plurality of diamond particles to form a second diamond particle region.

13. The method of claim 6, further comprising the step of interference fitting the particulate diamond region into a non-carbonaceous mass.

14. The method of claim 13, wherein said non-carbonaceous mass comprises copper.

15. The method of claim 6, further comprising step of forming a layer of diamond film adjacent the particulate diamond region.

16. The method of claim 15, wherein the step of forming is accomplished by depositing diamond film directly on a surface of the particulate diamond region via chemical vapor infiltration.

17. The method of claim 15, wherein the step of forming is accomplished by brazing the layer of diamond film to a surface of the particulate diamond region.

* * * * *